United States Patent [19]

Iwasa et al.

[11] Patent Number: 5,691,111
[45] Date of Patent: Nov. 25, 1997

[54] PHOTOSENSITIVE RESIN COMPOSITION USEFUL AS RESIST FOR DEEP UV LITHOGRAPHY CONTAINING SULFONIUM SALTS

[75] Inventors: Shigeyuki Iwasa; Kaichiro Nakano; Etsuo Hasegawa, all of Tokyo, Japan

[73] Assignee: NEC Corporation, Tokyo, Japan

[21] Appl. No.: 502,251

[22] Filed: Jul. 13, 1995

[30] Foreign Application Priority Data

Jul. 14, 1994 [JP] Japan .................. 6-162244

[51] Int. Cl.$^6$ .................................................. G03F 7/004
[52] U.S. Cl. .................. 430/270.1; 430/921; 522/15; 522/25
[58] Field of Search ................... 430/270.1, 921; 522/15, 25; 568/33, 36, 77; 562/113

[56] References Cited

U.S. PATENT DOCUMENTS 5,012,001  4/1991  Crivello ........................ 568/13
5,585,507  12/1996  Nakano et al. ................ 556/7

OTHER PUBLICATIONS

Hiroshi Ito et al., "Applications of Photoinitiators to the Design of Resists for Semiconductor Manufacturing", *Am. Chem. Soc.*, Symposium Series, vol. 242, 1984, pp. 11–23.
Crivello et al., "A New Preparation of Triarylsulfonium and –selenonium Salts via the Copper(II)–. . . and Selenides with Diaryliodonium Salts", *J. Org. Chem.*, vol. 43, No. 5, 1978, pp. 3055–3058.
T.X. Neenan et al., "Chemically Amplified Resists: A Lithographic Comparison of Acid Generating Species", *Proceedings of SPIE*, vol. 1086, 1989, pp. 2–10.
Takumi Ueno et al., "Chemical Amplification Positive Resist Systems Using Novel Sulfonates as Acid Generators", *Proceedings of PME '89*, Kodansha Press, 1990, pp. 413–424.
Dennis N. Kevill et al., "Essentially Solvent–Independent Rates of Solvolysis . . . tert–Butyl Derivatives and the $N_{KL}$ Solvent Nucleophilicity Scale", *J. Am. Chem. Soc.*, vol. 108, 1986, pp. 1579–1585.
Takechi et al., "Alicyclic Polymer for ArF and KrF Excimer Resist Based on Chemical Amplification", *Journal of Photopolymer Science and Technology*, vol. 5, No. 3, 1992, pp. 439–446.
George L. Gaines, Jr., "Solvatochromic Compound as an Acid Indicator in Nonaqueous Media", *Analytical Chemistry*, vol. 48, No. 2, Feb. 1976, pp. 450–451.

*Primary Examiner*—Christopher G. Young
*Attorney, Agent, or Firm*—Sughrue, Mion, Zinn, Macpeak & Seas, PLLC

[57] ABSTRACT

The invention provides a photosensitive resin composition useful as a photoresist of chemical amplification type for deep UV lithography such as ArF excimer laser lithography. The resin composition contains, as an acid generator, an alkylsulfonium salt of the general formula (I), wherein $R^1$ is a $C_7$ to $C_{12}$ alkyl having a bridged alicyclic structure or a $C_5$ to $C_7$ monocyclic alkyl, $R^2$ is an alkyl, $R^3$ is a $C_5$ to $C_7$ β-oxomonocyclic alkyl or a $C_7$ to $C_{10}$ bridged cyclic alkyl having oxo group at the β-position. The general formula (I) is inclusive of novel alkylsulfonium salts in which $R^1$ is norbornyl group, adamantyl group or cyclohexyl group, $R^2$ is methyl group and $R^3$ is β-oxocyclohexyl group or β-oxonorbornane-2-yl group.

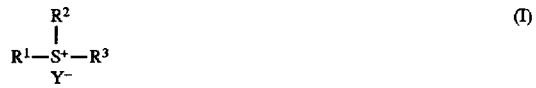

22 Claims, 2 Drawing Sheets

PHOTOSENSITIVE RESIN COMPOSITION USEFUL AS RESIST FOR DEEP UV LITHOGRAPHY CONTAINING SULFONIUM SALTS

BACKGROUND OF THE INVENTION

This invention relates to a photosensitive resin composition which is suitable for use as a photoresist in photolithography using deep UV (ultraviolet) radiation (220–180 nm in wavelength) and a group of novel sulfonium salts which are useful in the photosensitive resin composition as the photosensitive component.

In the field of microelectronic devices there is a continuing trend toward higher density of circuits and higher integration of circuit components. Accordingly the high resolution requirements of photolithographic techniques for patterning are becoming still stricter.

In photolithography an effective means to generate finer patterns is to shorten the wavelength of the exposure light used in patterning a photoresist film. In general, the resolving power R of an optical system (minimum line width resolved by photolithography) is given by the Rayleigh's formula, $R=k\cdot\lambda/NA$, where $\lambda$ is the wavelength of light, NA is the numerical aperture of lens and k is a process factor. That is, the value of R becomes smaller as the wavelength $\lambda$ becomes shorter. For instance, for the fabrication of up to 64 Mbit DRAMs (dynamic random access memories) it is necessary to resolve 0.35 µm lines and spaces, and accordingly g-line (438 nm) or i-line (365 nm) of high-pressure mercury lamp has been used as the exposure light. For the fabrication of 256 Mbit or more highly integrated DRAMs it is necessary to resolve 0.25 µm or still finer lines and spaces, and for this purpose it will be favorable to use deep UV rays emitted from excimer lasers such as KrF (248 nm), KrCl (222 nm), ArF (193 nm) and $F_2$ (157 nm) lasers. Currently elaborate studies have been made on KrF excimer laser lithography.

For deep UV lithography using an excimer laser it is necessary to use a high sensitivity photoresist (hereinafter, simply resist) because it is very important to augment the cost performance of the excimer laser in view of several problems inherent to excimer lasers such as high cost of the laser apparatus and short life of the excimer laser gas. A recently prevailing way to formulate a high sensitivey resist is to use an acid generator, i.e. a compound that photochemically generates a protonic acid. A resist containing an acid generator is called a chemically amplified resist or chemical amplification resist. Ito et al., Am. Chem. Soc., Symposium Series, Vol. 242 (1984), pp. 11–23 show the applicability of chemical amplification resists using some onium salts to KrF excimer laser lithography. When a chemical amplification resist is used, the interaction between the photogenerated acid and the polymer component of the resist is accelerated by post-exposure baking of the resist film, and consequently a chemical change of the polymer component is amplified hundredfold or thousandfold in the manner of a catalyst reaction. Therefore, chemical amplification resists exhibit remarkably high sensitivities by comparison with conventional resists in which the photoreaction efficiency (reaction per single photon) is below 1. Until now several kinds of acid generators have been reported: for example, triphenylsulfonium salt derivatives by Crivello et al., J. of Org. Chem., Vol. 43, No. 15 (1978), pp. 3055–3058; 2,6-dinitrobenzyl esters by Neenan et al., Proceedings of SPIE, Vol. 1086 (1989), pp. 2–10; and 1,2,3-tri(methanesulfonyloxy)benzene by Ueno et al., Proceedings of PME '89, Kodansha Press (1990), pp. 413–424.

Most resists that have recently been developed, or are currently under development, are of chemical amplification type. Certainly the employment of chemical amplification is essential to the development of high sensitivity resists suitable for deep UV lithography.

Now it is important to develop a chemical amplification resist which is high in transparency to deep UV radiation shorter than 220 nm in wavelength and contains an acid generator that is high in photoreaction efficiency (acid generation efficiency) when exposed to such deep UV radiation.

In the current photolithographic processes it is usual to use a monolayer resist film having a thickness of about 0.7–1.0 µm, and most of hitherto developed chemical amplification resists are for use as a monolayer film. If these resists are used in combination with 220 nm or shorter wavelength radiation such as ArF excimer laser light (193 nm), patterning of the resist film is obstructed by strong absorption of the exposure light by the resist. That is, the exposure light is mostly absorbed in a shallow region of the resist film adjacent to the light indidence surface so that the light scarcely reaches the bottom of the resist film. Therefore, in the bottom region of the resist film little change occurs between the exposed areas and masked areas, and the consequence is a failure to generate a fine pattern in the resist film. Thus, currently available resists are unsuited to ArF excimer laser lithography which is a promising candidate for the next generation patterning technique.

The base component of a resist is an organic polymer. In most conventional resists for exposure to the i-line the base polymer is a novolac resin. In chemical amplification resists for exposure to KrF excimer laser light, poly(p-vinylphenol) is widely used as the base polymer. Both novolac resins and poly(p-vinylphenol) have aromatic ring(s) in the repeating units, and the dry etching resistance of these polymers is attributed to the aromatic rings. However, these polymers exhibit strong absorptions in spectral regions shorter than the wavelength of KrF excimer laser (248 nm). Therefore, these polymers cannot be used in resists for lithographic processes using radiation of shorter wavelength, particularly shorter than 220 nm. Meanwhile, there is a report of an alicyclic polymer, a copolymer of adamantylmethacrylate and tert-butylmethacrylate, which is resistant to dry etching and fairly transparent to both KrF excimer laser light and ArF excimer laser light: Takechi et al., J. of Photopolymer Science and Technology, Vol. 5, No. 3 (1992), pp. 439–446.

The photosensitive agents or acid generators in known resists for KrF excimer laser light or longer wavelength radiation exibit strong absorptions in spectral regions shorter than 220 nm and therefore cannot be used in resists for ArF excimer laser lithography. The main reason for the strong absorptions at wavelenghts shorter than 220 nm is the existence of aromatic rings in the molecular structure of every acid generator.

Besides, it is desired that chemical amplification resists are good in stability at high temperatures employed in the fabrication of microelectronic devices. In lithographic processes it is usual to perform prebaking and post-exposure baking at temperatures ranging from 80° to 120° C., and in general relatively high temperatures are favorable. In prebaking, high temperature promotes dissipation of the solvent. In post-exposure baking, high temperature enhances the efficiency of chemical amplification. These effects of high temperature baking treatments contribute to the generation of high resulution patterns in resist films. Furthermore, in practical applications the enhancement of the efficiency of chemical amplification is very important for a reduction in the cost of exposure light such as ArF excimer laser light. In the fabrication of semiconductor devices it is usual to perform another baking treatment of wafers on which a resist pattern is already formed in order to completely remove moisture and solvents from the resist pattern before an etching operation, and this baking treatment is usually made at a temperature of 100°-120° C. The resist needs to be stable and retain the pattern shape at this temperature.

SUMMARY OF THE INVENTION

It is an object of the present invention to provide a photosensitive resin composition, which contains an acid generator and is high in both transparency and photosensitivity to deep UV radiations ranging from 220 to 180 nm in wavelength, good in high temperature stability up to 120° C. or above and accordingly suitable for use as a resist for deep UV lithography using, for example, ArF excimer laser light.

It is another object of the invention to provide novel alkylsulfonium salts each of which is useful as the acid generator in a photosensitive resin composition according to the invention.

The present invention provides a photosensitive resin composition comprising an alkylsulfonium salt which is represented by the general formula (1A) or the general formula (1B) and photochemically acts as an acid generator and an organic polymer having at least one functional group which is susceptible to acidolysis:

(1A)

where $R^1$ is a $C_7$ to $C_{12}$ alkyl group having a $C_7$ to $C_{10}$ bridged alicyclic hydrocarbon structure, $R^2$ is (i) a $C_7$ to $C_{12}$ alkyl group having a $C_7$ to $C_{10}$ bridged alicyclic hydrocarbon structure or (ii) a $C_1$ to $C_7$ linear, branched or monocyclic alkyl group, $R^3$ is a $C_5$ to $C_7$ β-oxomonocyclic alkyl group, and $Y^-$ is a counter ion:

(1B)

where $R^{1'}$ is a $C_5$ to $C_7$ monocyclic alkyl group, $R^{2'}$ is (i) a $C_5$ to $C_7$ monocyclic alkyl group or (ii) a $C_1$ to $C_8$ linear, branched or monocyclic alkyl group, $R^{3'}$ is a $C_7$ to $C_{10}$ bridged cyclic alkyl group having oxo group at the β-position, and $Y^-$ is a counter ion.

The alkylsulfonium salts used in this invention have at least one bridged alicyclic hydrocarbon structure and oxo group. These alkylsulfonium salts are photosensitive in deep UV region and act as acid generators, and these sulfonium salts are remarkably low in absorption of light at wavelengths ranging from 220 to 180 nm by comparison with triphenylsulfonium trifluoromethanesulfonate (abbreviated to TPS) described in the Crivello reference mentioned hereinbefore.

The photosensitive resin composition according to the invention are useful as resists for photolithographic processes using radiation at wavelengths shorter than about 220 nm, and particularly at wavelengths ranging from 220 to 180 nm.

Furthermore, the invention provides a group of novel alkylsulfonium salts which are each represented by the general formula (1A) or (1B) and collectively represented by the general formula (1C):

(1C)

where $R^{1''}$ is norbornyl group, adamantyl group or β-oxonorbornane-2-yl group, $R^{2''}$ is methyl group, $R^{3''}$ is β-oxocyclohexyl group or cyclohexyl group with the proviso that $R^{3''}$ is β-oxocyclohexyl group when $R^{1''}$ is norbornyl group or adamantyl group, and $Y^-$ is a counter ion.

Norbornyl group:

Adamantyl group:

Cyclohexyl group:

These novel alkylsulfonium salts generate protonic acids by exposure to deep UV radiation and exhibit high photosenstivities to deep UV rays. Furthermore, by comparison with TPS, the novel sulfonium salts are remarkably better in transparency to deep UV rays ranging from 220 to 180 nm. Still further, the decomposition temperatures of the novel sulfonium salts are above 150° C.

It is suitable and preferable to use any of the novel sulfonium salts in a photosensitve resin composition according to the invention. The obtained resin composition is useful as a high sensitivity resist for deep UV lithography such as ArF excimer laser lithography, and by using that resist it becomes possible to raise the baking temperatures in the lithographic process to about 150° C.

Besides, the novel sulfonium salts can be used as photoinitiators for cationic photopolymerization reactions using short wavelength radiation.

DESCRIPTION OF THE PREFERRED EMBODIMENTS

A photosensitive resin composition according to the invention is, essentially, a mixture of an alkylsulfonium salt of the general formula (1A) or (1B) and an organic polymer having at least one functional group which is susceptible to acidolysis. If desired it is possible to jointly use two or more kinds of sulfonium salts of the general formula (1A) or (1B) and/or two or more kinds of polymers.

In the photosentive resin composition the proportion of the sulfonium salt to the polymer is usually from 0.1:99.9 to 40:60 by weight and preferably from 0.5:99.5 to 25:75 by weight. If the amount of the sulfonium salt is less than 0.1 wt % the resin composition is insufficient in photosensitivity for use as a photoresist. If the sulfonium salt amounts to more than 40 wt %, difficulty arises in forming a uniform film of the resin composition by applying a solution of the composition onto a substrate, and a photolithographic process for generating a pattern in the film will suffer from the existence of scum on the developed pattern.

In the general formula (1A) of a group of alkylsulfonium salts useful in this invention, $R^1$ is a $C_7$ to $C_{12}$ alkyl group having a $C_7$ to $C_{10}$ bridged alicyclic hydrocarbon structure. Preferred examples of $R_1$ are norcaranyl group (viz. bicyclo [5.1.0]heptyl group), norpinanyl group (viz. bicyclo[3.1.0] hyptyl group), norbornyl group (viz. bicyclo[2.2.1]heptyl group), bicyclo[2.2.2]octyl group, bicyclo[3.2.1]octyl group, tricyclo[2.2.1.0$^{2.6}$]heptyl group, adamantyl group (viz. tricyclo[3.3.1.1$^{3.7}$]decanyl group), tricyclo-[5.2.1.0$^{2.6}$] decanyl group, tricyclo[5.3.1.1$^{2.6}$]dodecyl group, tricylco [4.4.1.1$^{1.5}$]dodecyl group, caranyl group, pinanyl group and bornyl group. $R^2$ is either (i) a $C_7$ to $C_{12}$ alkyl group having a $C_7$ to $C_{10}$ bridged alicyclic hydrocarbon structure or (ii) a $C_1$ to $C_7$ linear, branched or monocyclic alkyl group. Examples of (i) are as listed above with respect to $R^1$. Examples of (ii) are methyl, ethyl, n-propyl, isopropyl, n-butyl, sec-butyl, tert-butyl, pentyl, hexyl, heptyl, cyclopentyl, cyclohexyl, cycloheptyl, cyclopropylmethyl, 4-methylcyclohexyl and cyclohexylmethyl groups. In most cases $R^2$ is (ii). $R^3$ is a $C_5$ to $C_7$ β-oxomonocyclic alkyl group. From industrial and economical points of view, preferred examples of $R^3$ are β-oxocyclopentyl group, β-oxocyclohexyl group and β-oxocycloheptyl group.

In the general formula (1B) of another group of alkylsulfonium salts useful in this invention, $R^{1'}$ is a $C_5$ to $C_7$ monocyclic alkyl group. Examples of $R^{1'}$ are cyclopentyl group, cyclohexyl group, cycloheptyl group, 4-methylcyclohexyl group and cyclohexylmethyl group. $R^{2'}$ is either (i) a $C_5$ to $C_7$ monocyclic alkyl group or (ii) a $C_1$ to $C_8$ linear, branched or monocyclic alkyl group. Examples of (i) are as listed above with respect to $R^{1'}$. Examples of (ii) are methyl, ethyl, n-propyl, isopropyl, n-butyl, sec-butyl, tert-butyl, pentyl, hexyl, heptyl, octyl, cyclopentyl, cyclohexyl, cycloheptyl, cyclopropylmethyl, 4-methylcyclohexyl and cyclohexylmethyl groups. $R^{3'}$ is a $C_7$ to $C_{10}$ bridged cyclic alkyl group having oxo group at the β-position. Examples of $R^{3'}$ are β-oxonorcaranyl group (viz. β-oxo-bicyclo[5.1.0]heptyl group), β-oxonorpinanyl group (viz. β-oxobicyclo[3.1.0]heptyl group), β-oxonorbornyl group (viz. β-oxobicyclo[2.2.1]heptyl group), β-oxoadamantyl group, β-oxobicyclo[2.2.2]octyl group, β-oxobicyclo-[3.2.1]octyl group, β-oxotricyclo[2.2.1.0$^{2.6}$] heptyl group, β-oxocaranyl group, β-oxopinanyl group and β-oxobornyl group.

In both general formulas (1A) and (1B), the counter ion $Y^-$ can be selected from various anions such as, for example, $BF_4^-$ (tetrafluoroborate ion), $AsF_6^-$ (hexafluoroarsenate ion), $SbF_6^-$ (hexafluoroantimonate ion), $PF_6^-$ (hexafluorophosphate ion), $CF_3SO_3^-$ (trifluoromethanesulfonate ion), $CH_3SO_3^-$ (methanesulfonate ion), $ClO_4^-$ (perchlorate ion), $Br^-$, $Cl^-$ and $I^-$. However, it is preferred to select one of $BF_4^-$, $AsF_6^-$, $SbF_6^-$, $PF_6^-$ and $CF_3SO_3^-$ because protonic acids of these ions are relatively high in stability at high temperatures employed in post-exposure baking treatments of resist films in the fabrication of semiconductor devices and, hence, are not likely to cause intrusion of impurity ions into the products.

The polymer for the photosensitive resin composition must be fairly high in transparency to deep UV rays. It is suitable to use a polymer which is, as a film having a thickness of 1 μm, not lower than 40% in transmittance of deep UV rays ranging from 220 to 180 nm in wavelength. It is preferred to use a polymer having the structure represented by the general formula (2) or the general formula (3). As mentioned above, it is possible to use a mixture of two or more kinds of polymers each of which is represented by the general formula (2) or (3).

where $R^4$ is a monocyclic or bridged cyclic hydrocarbon group, $R^5$ is methyl group, ethyl group, propyl group, tert-butyl group, tetrahydropyran-2-yl group, tetrahydrofuran-2-yl group or 3-oxocyclohexyl group. $R^6$, $R^7$ and $R^8$ are independently hydrogen atom or methyl group, x+y+z=1, x is from 0.1 to 0.9 (preferably from 0.3 to 0.7), y is from 0.1 to 0.7 (preferably from 0.3 to 0.5), z is from 0.01 to 0.7 (preferably from 0.05 to 0.3), and n is an integer from 5 to 1000 (preferably from 10 to 200).

Preferred examples of $R^4$ in the formula (2) are norbornyl group, adamantyl group, cyclohexyl group and tricyclo [5.2.1.0$^{2.6}$]decanyl group (the formula is shown below).

where $R^6$ and $R^7$ are independently hydrogen atom or methyl group, $R^9$ is hydrogen atom, methyl group, ethyl group, propyl group, tert-butyl group, tert-butoxycarbonyl group, tetrahydropyran-2-yl group, tetrahydrofuran-2-yl group or 3-oxocyclohexyl group, $R^{10}$ and $R^{11}$ are independently $C_7$ to $C_{12}$ hydrocarbon group having a bridged cyclic hydrocarbon radical, w is from 0.1 to 0.99 (preferably from 0.4 to 0.8), and m is an integer from 5 to 1000 (preferably from 10 to 200).

Examples of $R^{10}$ and $R^{11}$ in the formula (3) are norbornane-2,3-diyl group, norbornane-2,3-dimethylene group, norbornane-2,5-dimethylene group, norbornane-2,6-dimethylene group, bicyclo[2.2.2]octene-2,3-dimethylene group, tricyclo[5.2.1.0$^{2.6}$]decane-diyl group, tricyclo [5.2.1.0$^{2.6}$]decanedimethylene group and adamantane-diyl group.

-continued

Norbornanedimethylene group: —CH₂—  —CH₂—

Bicyclo [2.2.2] octenedimethylene group: —CH₂—  —CH₂—

Tricyclo [5.2.1.0²·⁶] decane-diyl group:

Tricyclo [5.2.1.0²·⁶] decanedimethylene group: —CH₂—  —CH₂—

Adamantane-diyl group:

Usually the photosensitive resin composition is used as a solution in an organic solvent to form a film of the resin composition by a coating method. For this purpose it is possible to use any organic solvent which well dissolves both the polymer and the sulfonium salt in the resin composition and provides a solution suitable for application to a substrate surface by the conventional spin coating method. It is optional to use a mixture of two or more kinds of solvents. Examples of useful solvents are n-propyl alcohol, isopropyl alcohol, n-butyl alcohol, tert-butyl alcohol, methylcellosolve acetate, ethylcellosolve acetate, methyl lactate, ethyl lactate, 2-methoxybutyl acetate, 2-ethoxyethyl acetate, methyl pyruvate, ethyl pyruvate, methyl 3-methoxypropionate, ethyl 3-methoxypropionate, N-methyl-2-pyrrolidinone, cyclohexanone, cyclopentanone, cyclohexanol, methylethyl ketone, 1,4-dioxane, propylene glycol monoethyl ether acetate, ethylene glycol monomethyl ether, ethylene glycol monomethyl ether acetate, ethylene glycol monoethyl ether, ethylene glycol monoisopropyl ether, diethylene glycol monomethyl ether and diethylene glycol dimethyl ether.

The photosensitive resin composition, or its solution, may optionally contain an auxiliary component or auxiliary components selected from various additives to conventional resin compositions, such as surfactants, dyes, stabilizers, applicability improvers, etc.

When the photosentive resin composition is used as a resist in a photolithographic process, a developing liquid is used to partly dissolve the resist film after the exposure operation. The developing liquid is selected according to the solubilities of the polymer used in the resin composition and can be selected from organic solvents and aqueous or nonaqueous alkali solutions. It is possible to use a mixture of organic solvents or a mixture of an organic solvent and an aqueous alkali solution. For example, selections can be made from organic solvents such as acetone, methylethyl ketone, methyl alcohol, ethyl alcohol, isopropyl alcohol, tetrahydrofuran and dioxane; inorganic alkalis such as sodium hydroxide, potassium hydroxide, sodium silicate and ammonia; amines such as propylamine, ethylamine, dipropylamine, diethylamine, trimethylamine and triethylamine; and organic ammonium salts such as tetramethylammonium hydroxide, tetraethylammonium hydroxide, trimethylhydroxymethylammonium hydroxide, triethylhydroxymethylammonium hydroxide and trimethylhydroxyethylammonium hydroxide. According to the need the developing liquid may contain an additive or additives such as, for example, surfactant.

When a resist film using the invention is exposed to deep UV radiation such as ArF excimer laser light the sulfonium salt of, e.g., the general formula (1A) in the exposed regions of the film generates a protonic acid, HY in the following reaction formula (A).

where $R^{12}$, $R^{13}$ and $R^{14}$ are residuals of $R^1$, $R^2$ and $R^3$.

This protonic acid promotes decomposition of a functional group of the polymer in the resist film when the film is heated after the exposure (post-exposure baking in a photolithographic process). For example, the following reaction formula (B) shows a case where the polymer is of the general formula (2) and has tetrahydropyran-2-yl group as $R^4$ in the formula (2). By the action of heat and the protonic acid the tetrahydropyranyl group is detached from the polymer as 3,4-dihydro-2H-pyran, and the partly decomposed polymer has carboxylic group. Therefore, a great change occurs in the solubility of the resist film in a basic solution.

The reaction of the formula (B) is regarded as a deprotection reaction. When the post-exposure baking is performed at a suitably high temperature the deprotection reaction proceeds in the manner of catalyst reaction, so that the alkali solubility of the exposed regions of the resist film greatly increases. This is chemical amplification of the photosensitivity of the resist, and the magnitude of amplification becomes greater as the baking temperature is made higher. When the resist film is subsequently treated with an alkaline developing liquid the polymer in the exposed regions of the film readily dissolves in the developing liquid because of the existence of carboxyl group as a functional group. The dissolution of the exposed regions of the resist film results in that a positive pattern is generated in the film.

The novel alkylsulfonium salts of the general formula (1C) can be prepared by using known reactions. For example, it is possible to use the fundamentals of the method of preparing some alkylsulfonium salts reported by Kevill et al., J. of Am. Chem. Soc., Vol. 108, No. 7 (1988), pp. 1579-1585. An outline of the synthesis is as follows.

Three kinds of sulfide derivatives represented by the general formulas (4), (5) and (6) are dissolved in a suitable solvent such as nitromethane, and an alkyl halide of the general formula (7), (8) or (9) is added to the solution. A large excess quantity of the alkyl halide is used, i.e. 2 to 100 mols (preferably 5 to 20 mols) per mol of sulfide unit in the solution. Then the mixed solution is left reacting at room temperature for 0.5 to 5 h (preferably 1 to 2 h). After that an organic acid metal salt of the general formula (10), as a solution in nitromethane, is added to the reacted solution. The quantity of the metal salt is equimolar to sulfide unit in the starting mixture. Then, reaction is further continued for 3 to 24 h at temperatures ranging from room temperature to about 50° C. After that insoluble metal salt is filtered out, and the filtrate is concentrated and poured into a large quantity of a poor solvent such as diethyl ether to precipitate a crystalline product, which is a sulfonium salt of the general formula (1C). The product is purified by repeating dissolution in acetone and re-precipitation in diethyl ether.

$$R^{1''}-S-R^{2''} \quad (4)$$

$$R^{2''}-S-R^{3''} \quad (5)$$

$$R^{1''}-S-R^{2''} \quad (6)$$

$$R^{1''}-W \quad (7)$$

$$R^{2''}-W \quad (8)$$

$$R^{3''}-W \quad (9)$$

$$Ag^+Y^- \quad (10)$$

In these general formulas, $R^{1''}$, $R^{2''}$, $R^{3''}$ and $Y^-$ are as defined with respect to the general formula (1C), and W is a halogen atom such as I or Br.

EXAMPLE 1

Synthesis of β-oxocyclohexylmethyl(2-norbornyl) sulfonium trifluoromethanesulfonate The following process was performed under yellow lamp.

In a 300-ml egg-plant type flask 7.07 g (0.053 mol) of 2-chlorocyclohexanone was dissolved in 50 ml of ethanol, and 25 ml of 15% aqueous solution of sodium salt of methylmercaptan was added dropwise with a dropping funnel, and the mixture was stirred at room temperature for 3 h. The reaction mixture was poured into 300 ml of water, and an organic layer was extracted with methylene chloride, dried with magnesium sulfate and distilled to remove methylene chloride. After that reduced pressure distillation was performed to obtain 6.0 g of methylmercapto-2-chlorocyclohexanone (78% yield; b.p. 48.5°–47.5° C./0.3 mmHg).

Next, in a 300-ml egg-plant type flask 1 g (0.0078 mol) of methylcapto-2-cyclohexanone was dissolved in 5 ml of nitromethane, and the solution was stirred with a magnetic stirrer using teflon-coated stirring pieces. Using a dropping funnel, 10 g (0.057 mol) of 2-bromonorbornane was added to the solution, and stirring was continued at room temperature for 1 h. Then, a solution of 2 g (0.0078 mol) of silver trifluoromethanesulfonate in 100 ml of nitromethane was slowly added dropwise with a dropping funnel, and stirring was continued for 3 h. Then precipitated silver iodide was removed by filtration, and the solution was concentrated to a volume of 20 ml. The concentrated solution was poured into 300 ml of diethyl ether to obtain a crystalline precipitate, which was repeatedly washed with diethyl ether. After washing, the crystalline product was dissolved in acetone and recrystallized in ether, and this process was repeated twice. The ultimate product was 1.15 g of white crystals which were proved to be of the aimed compound (38% yield) by thermal analysis, NMR and IR spectroscopy and elementary analysis: The analytical results were as follows.

Melting point: 111°–113° C. Decomposition point: 152° C.
$^1$H-NMR (CDCl$_3$; internal standard was tetramethylsilane): δ(ppm)
1.35–2.28 (m, 16H), 2.30–3.09 (m, 5H), 3.67–3.78 (m, 1H), 4.95–5.31 (m, 1H).

IR (KBr tablet): (cm$^{-1}$)
3020, 2940 (C—H), 1746 (C=O), 1420 (C—H), 1260 (C—F), 1160, 1032 (SO$_3$)

| Elementary Analysis | | | |
|---|---|---|---|
| | C | H | S |
| Found (wt %) | 46.55 | 5.60 | 16.42 |
| Calc'd (wt %) *) | 46.62 | 5.48 | 16.59 |

*) for C$_{15}$H$_{21}$O$_4$F$_3$S$_2$ (MW: 386.44)

EXAMPLE 2

Synthesis of cyclohexylmethyl(β-oxonorbornyl) sulfonium trifluoromethanesulfonate The following process was performed under yellow lamp.

In a 300-ml egg-plant type flask provided with cooling pipe for reflux, a mixture of 8.03 g (0.069 mol) of cyclohexylmercaptan, 2.8 g (0.07 mol) of sodium hydroxide and 80 ml of ethanol was heated for refluxing. After complete dissolution of sodium hydroxide the solution was cooled to room temperature. Then 10 g (0.0695 mol) of 3-chloronorbornane was added with a dropping funnel, and the mixture was stirred at 50° C. for 1 hr. The reaction mixture was put into 300 ml of water, and an organic layer was extracted with methylene chloride, dried with magnesium sulfate and distilled to remove methylene chloride. By subsequent coloumn chromatography using methylene chloride as developing solvent, 3.8 g of cyclohexylmercapto-β-oxonorbornane was obtained (35% yield).

Next, in a 300-ml egg-plant type flask 2.0 g (0.0093 mol) of cyclohexylmercapto-β-oxonorbornane was dissolved in 15 ml of nitromethane, and the solution was stirred with a magnetic stirrer using teflon-coated stirring pieces. Then 13.2 g (0.093 mol) of methyl iodide was added dropwise to the solution, and stirring was continued at room temperature for 3 h. Then, a solution of 2.39 g (0.0093 mol) of silver trifluoromethanesulfonate in 100 ml of nitromethane was slowly added with a dropping funnel, and stirring was continued for 3 h. After that precipitated silver iodide was removed by filtration, and the solution was concentrated to a volume of 20 ml. The concentrated solution was poured into 200 ml of diethyl ether to obtain a crystalline precipitate, which was repeatedly washed with diethyl ether. After washing, the crystalline product was dissolved in acetone and recrystallized in ether, and this process was repeated twice. The ultimate product was 1.28 g of white crystals which were proved to be of the aimed compound (36% yield) by thermal analysis, NMR and IR spectroscopy and elementary analysis.

Melting point: 110°–113° C. Decomposition point: 151° C.
$^1$H-NMR (CDCl$_3$; internal standard was tetramethylsilane): δ(ppm)
1.35–2.28 (m, 17H), 2.30–3.09 (m, 4H), 3.67–3.78 (m, 1H), 4.95–5.31 (m, 1H).
IR (KBr tablet): (cm$^{-1}$) 3020, 2940 (C—H), 1746 (C=O), 1420 (C—H), 1260 (C—F), 1160, 1032 (SO$_3$)

|  | Elementary Analysis | | |
|---|---|---|---|
|  | C | H | S |
| Found (wt %) | 46.41 | 5.71 | 16.22 |
| Calc'd (wt %) *) | 46.62 | 5.48 | 16.59 |

*) for C$_{15}$H$_{21}$O$_4$F$_3$S$_2$ (MW: 386.44)

EXAMPLE 3

Synthesis of adamantylmethyl(β-oxocyclohexyl)sulfonium trifluoromethanesulfonate The process of Example 1 was repeated except that 12.13 g (0.057 mol) of 2-bromoadamantane was used instead of 2-bromonorbornane (0.057 mol) in Example 1. The yield of the aimed compound was 0.8 g (24% yield). Melting point: 113°–115° C. Decomposition point: 155° C.
$^1$H-NMR (CDCl$_3$; internal standard was tetramethylsilane): δ(ppm)
1.32–2.28 (m, 20H), 2.30–3.11 (m, 5H), 3.65–3.8 (m, 1H), 4.95–5.3 (m, 1H)
IR (KBr tablet): (cm$^{-1}$)
3020, 2940 (C—H), 1746 (C=O), 1420 (C—H), 1260 (C—F), 1160, 1032 (SO$_3$)

|  | Elementary Analysis | | |
|---|---|---|---|
|  | C | H | S |
| Found (wt %) | 50.20 | 6.18 | 14.82 |
| Calc'd (wt %) *) | 50.45 | 6.36 | 14.94 |

*) for C$_{18}$H$_{27}$O$_4$F$_3$S$_2$ (MW: 428.53)

EXAMPLE 4

Spectral transmissivity of the compound of Example 1

A solution was prepared by dissolving 1.5 g of poly(methyl methacrylate) (PMMA) having an average molecular weight of 12000 and 0.75 g (5 wt % of PMMA) of the alkylsulfonium salt prepared in Example 1 in 6 g of ethyl cellosolve acetate, and the solution was filtered through a 0.2 μm membrane filter.

The solution was spin coated onto a quartz substrate and baked on a hot plate at 100° C. for 120 sec. As the result, a film having a thickness of about 1 μm was formed on the substrate. Spectral transmissivity of the film was measured with a spectrophotometer over a visible-to-UV range. For comparison, a film of pure PMMA and a film of a mixture of PMMA and TPS (5 wt % of PMMA) were subjected to the same test. The results are shown in FIG. 1.

Figure 1:
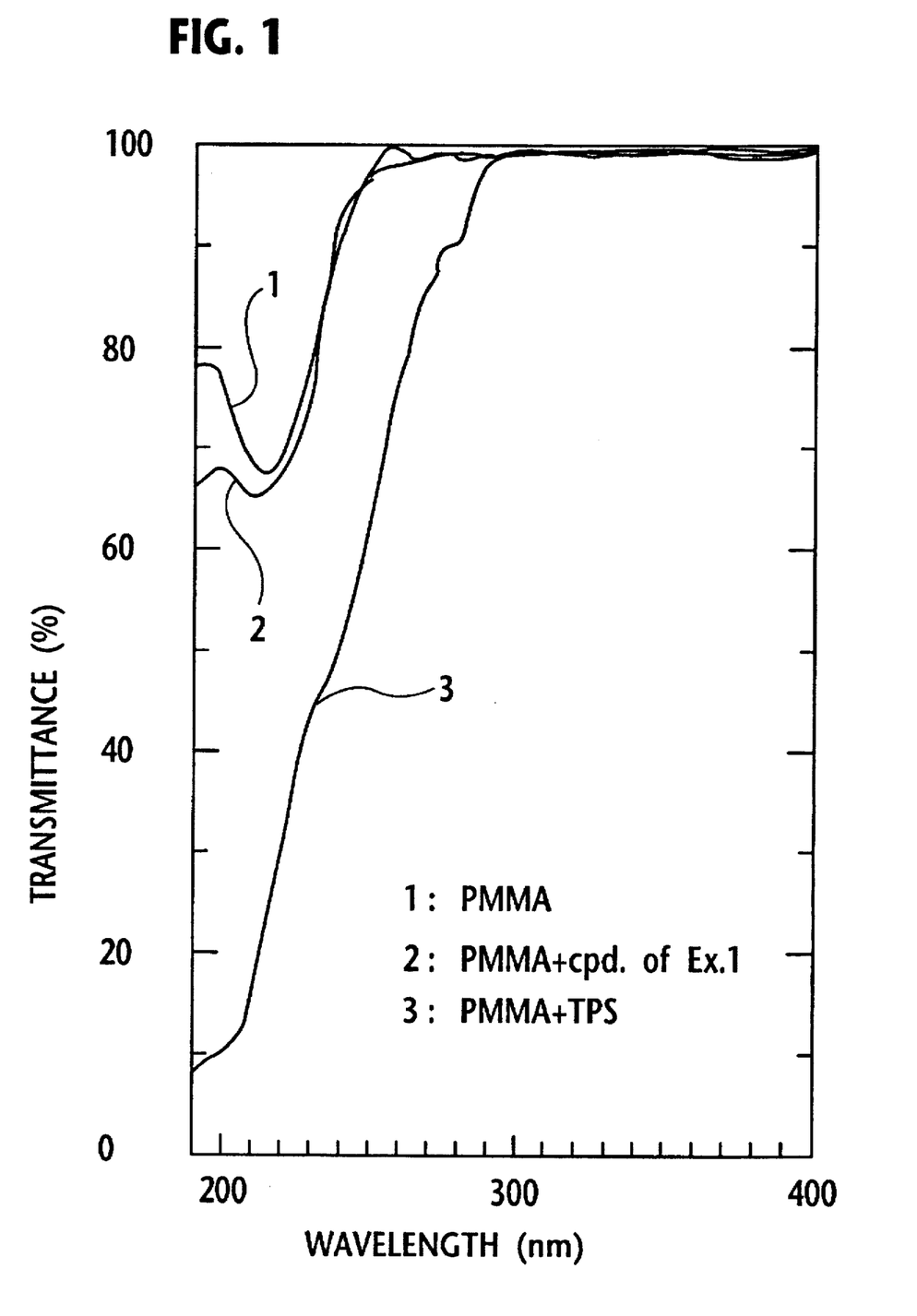
FIG. 1 is a chart showing UV transmittances of three kinds of resin films one of which contains an alkylsulfonium salt of the invention.

In FIG. 1 it is seen that the PMMA film containing the alkylsulfonium salt of Example 1 retains fairly high transmittance at wavelengths shorter than 220 nm, whereas the PMMA film containing TPS becomes very low in transmittance at such short wavelengths.

EXAMPLE 5

Acid generating capability of the compound of Example 1

A solution of PMMA and the alkylsulfonium salt of Example 1 was prepared in the same manner as in Example 4. The solution was spin coated onto a 3-inch silicon wafer and prebaked at 100° C. to form a film having a thickness of 1.0 μm. The film was irradiated with ArF excimer laser light (center wavelength 193.3 nm). The exposurae dose was 40 mJ/cm$^2$, and the exposed area was 20 cm$^2$. The quantity of acid photochemically generated in the film was measured by a the following method which is analogous to the method described in Analytical Chemistry, Vol. 48, No. 2 (1976), pp. 450–451. After the exposure the film was dissolved in acetonitrile, and the solution was added to another acetonitrile solution containing sodium salt of tetrabromophenol blue, and the absorption spectrum of the mixed solution for visible light was measured to determine the quantity of the generated acid from a change in absorbance at 619 nm. The determined quanity of the generated acid was 30 nmol, which was regarded as sufficient for photolithographic patterning with submicron resolution.

EXAMPLE 6

Acid generating capability of the compound of Example 2

The alkylsulfonium salt of Example 2 was tested by the same method as in Example 5. The quantity of the generated acid was determined to be 28 nmol, which was regarded as satisfactory.

EXAMPLE 7

Acid generating capability of the compound of Example 3

The cycloalkylsulfonium salt of Example 3 was tested by the same method as in Example 5. The quantity of the generated acid was determined to be 25 nmol, which was regarded as satisfactory.

COMPARATIVE EXAMPLE 1

Acid generation of a known sulfonium salt was tested by the same test method as in Example 5. The sulfonium salt was 1-adamantyldimethylsulfonium trifluoromethanesulfonate, reported by Kevill et al., J. Am. Chem. Soc., Vol. 108 (1986), pp. 1579–1585.

In this case the quantity of the generated protonic acid was 1 nmol, which was only 1/30 of the quantity of acid generated in Example 5 by the sulfonium salt of Example 1. Such a great difference is primarily attributed to the existence of ketone structure in the sulfonium salt of Example 1.

REFERENTIAL EXAMPLE 1

Preparation of a copolymer for resist compositions

To use as the base resin of the resist compositions in the following examples, a copolymer of tricyclo-[5.2.1.0$^{2.6}$]decanyl acrylate, tetrahydropyranyl methacrylate and methacrylic acid was prepared by the following process.

In a 300-ml egg-plant type flask with a three-way cock, 14.0 g (0.068 mol) of tricyclo[5.2.1.0$^{2.6}$]decanyl acrylate, 6.8 g (0.04 mol) of tetrahydropyranyl methacrylate and 0.52 g (0.006 mol) of methacrylic acid were dissolved in 80 ml of dried tetrahydrofuran (THF) in argon gas atmosphere. As a polymerization initiator, 0.918 g (0.015 mol) of azobisisobutyronitrile (AIBN), as a solution in 30 ml of THF, was added to the initial solution, and the mixed solution was heated at 60°–65° C. for about 1 h. Then the reaction solution was poured into 500 ml of hexane to precipitate a copolymer, and re-precipitation was made. The precipitate was recovered by filtration and dried overnight under reduced pressure. The dried product was 8.5 g of a copolymer in the form of white powder. In the copolymer the proportions of tricyclodecanyl acrylate units, tetrahydropyranyl methacrylate units and methacrylic acid units were 60:35:5. By gel permeation chromatography the copolymer had an average molecular weight of 43000 (calculated as polystyrene). This copolymer will be referred to as copolymer CDHPM.

EXAMPLE 8

Test of a resist using the compound of Example 1

The following process was performed under yellow lamp.

A solution of a resist composition was prepared by dissolving 2.97 g of copolymer CDHPM and 0.03 g of the sulfonium salt of Example 1 in 12.00 g of propylene glycol monomethyl ether acetate. The solution was filtered through a 0.2 µm teflon filter.

Figure 2A:
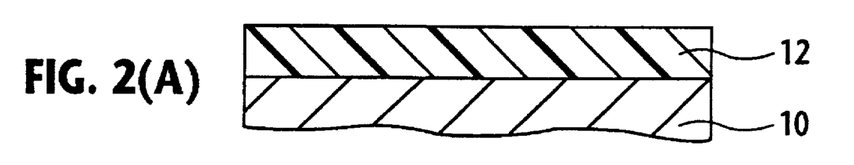
FIGS. 2(A) to 2(C) illustrate, in schematic sectional views, a photolithographic process for generating a positive resist pattern on a substrate.

Referring to FIG. 2(A), the resist solution was spin coated onto a substrate 10, which was a 3-inch silicon wafer, and baked on a hot plate (not shown) at 105° C. for 60 sec to form a resist film 12 having a thickness of 0.7 µm. For the ArF excimer laser light used in Example 5, the transmittance of this resist film was 73.2% per 1 µm thickness. That is, as a monolayer resist this resist film was sufficiently high in transparency.

Figure 2B:
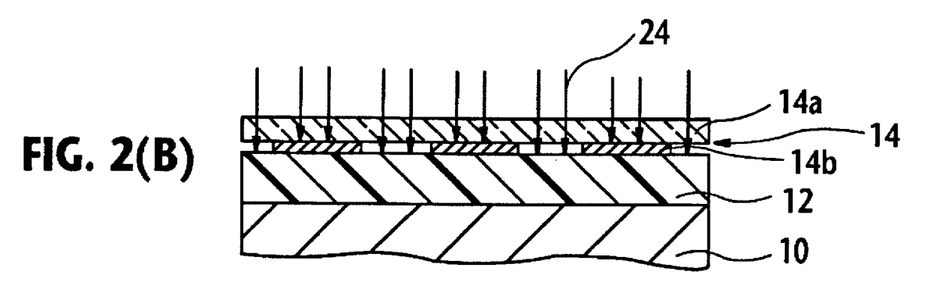
Figure 3:
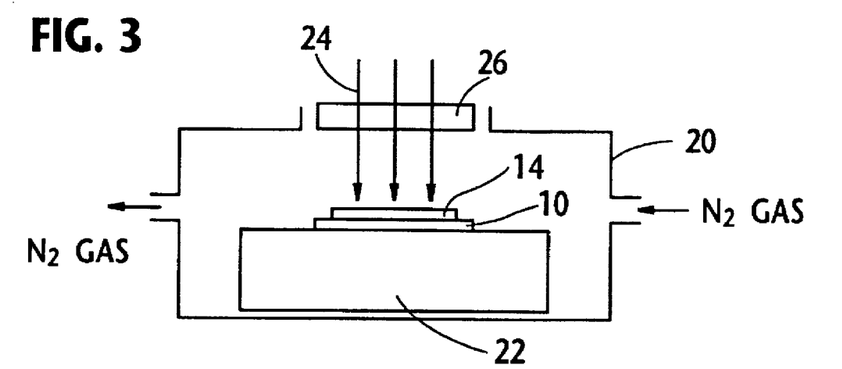
FIG. 3 is a diagrammatic illustration of an experimental exposure apparatus used in examples of the invention.

An experimental exposure apparatus of contact printing type was used. Referring to FIG. 3, in a glove box 20 thoroughly purged with N$_2$ gas, the substrate 10 of FIG. 2(A) (with the resist film 12) was placed on an X-Y stage 22, and a mask 14 was placed on and in contact with the resist film. Referring to FIG. 2(B), the mask 14 consisted of a transparent quartz plate 14$a$ and an opaque pattern 14$b$ formed of chromium. Through the mask 14 the resist film 12 was exposed to the aforementioned ArF excimer laser light 24. In FIG. 3 numeral 26 indicates an optical homogenizer.

Figure 2C:
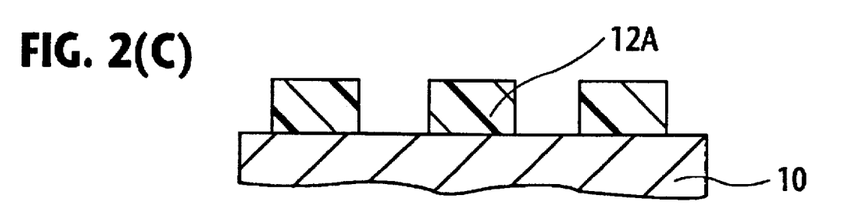

Immediately after the exposure the resist film 12 was baked at 120° C. for 40 sec on a hot plate. Then the film 12 was developed in an alkaline developing solution (1.0 wt % aqueous solution of tetramethylammonium-hydroxide) at 23° C. for 60 sec and rinsed in purified water for 60 sec. The exposed areas of the resist film 12 were dissolved in the developing solution, and in consequence, as shown in FIG. 2(C), a resin pattern 12A of positive type was formed on the substrate 10. In this example, 0.25 µm lines and spaces were resolved when the exposure energy was 35 mJ/cm$^2$.

EXAMPLE 9

Test of resists using the compounds of Ex. 2 and 3

The photolithographic experiment of Example 8 was repeated except that the sulfonium salts of Examples 2 and 3 were alternately used instead of the sulfonium salt of Example 1. In both cases 0.25 µm lines and spaces were resolved.

COMPARATIVE EXAMPLE 2

The experiment in Example 8 was made on a different resist composition.

In this case a solution of a resist composition was prepared by dissolving 2.85 g of copolymer CDHPM and, as an acid generator, 0.15 g of 2-oxocyclohexyl[methyl(2-cyclohexyl)sulfonium trifluoromethanesulfonate] in 12.00 g of propylene glycol monomethyl ether acetate. The solution was filtered through a 0.2 µm teflon filter.

To form a 0.7 µm thick film of the resist composition, the solution was spin coated onto the silicon substrate and baked at 105° C. for 60 sec. For the ArF laser light the transmittance of the resist film was 70% per 1 µm thickness. That is, the transparency of the resist film was sufficiently high. The exposure and development operations in Example 8 were slightly modified only in that the post-exposure baking was performed at 105° C. for 90 sec and that the concentration of the developing solution was 2 wt %.

The result of the experiment was a failure to generate a good resin pattern.

What is claimed is:

1. A photosensitive resin composition which is useful as a photoresist for photolithographic processes using deep UV radiation, the resin composition comprising an organic polymer having at least one acidolysis-susceptible functional group and an alkylsulfonium salt represented by the general formula (1A) or the general formula (1B):

where R$^1$ is a C$_7$ to C$_{12}$ alkyl group having a C$_7$ to C$_{10}$ bridged alicyclic hydrocarbon structure, R$^2$ is (i) a C$_7$ to C$_{12}$ alkyl group having a C$_7$ to C$_{10}$ bridged alicyclic hydrocarbon structure or (ii) a C$_1$ to C$_7$ linear, branched or monocyclic alkyl group, R$^3$ is a C$_5$ to C$_7$ β-oxomonocyclic alkyl group, and Y$^-$ is a counter ion:

where R$^{1'}$ is a C$_5$ to C$_7$ monocyclic alkyl group, R$^{2'}$ is (i) a C$_5$ to C$_7$ monocyclic alkyl group or (ii) a C$_1$ to C$_8$ linear, branched or monocyclic alkyl group, R$^{3'}$ is a C$_7$ to C$_{10}$ bridged cyclic alkyl group having oxo group at the β-position, and Y$^-$ is a counter ion.

2. A resin composition according to claim 1, wherein the alkylsulfonium salt is according to the formula (1A), and R$^1$ in the general formula (1A) is norcaranyl group, norpinanyl group, norbornyl group, bicyclo[2.2.2]octyl group, bicyclo [3.2.1]octyl group, adamantyl group, tricyclo[2.2.1.0$^{2.6}$] heptyl group, tricyclo[5.2.1.0$^{2.6}$]decanyl group, tricyclo [5.3.1.1$^{2.6}$]dodecyl group, tricyclo[4.4.1.1$^{1.5}$]dodecyl group, caranyl group, pinanyl group or bornyl group.

3. A resin composition according to claim 2, wherein R$^3$ in the general formula (1A) is β-oxocyclopentyl group, β-oxocyclohexyl group or β-oxocycloheptyl group.

4. A resin composition according to claim 1, wherein the alkylsulfonium salt is according to the formula (1B), and $R^{3'}$ in the general formula (1B) is β-oxonorcaranyl group, β-oxonorpinanyl group, β-oxonorbornyl group, β-oxoadamantyl group, β-oxobicyclo[2.2.2]octyl group, β-oxobicyclo[3.2.1]octyl group, β-oxotricyclo[2.2.1.0$^{2.6}$]heptyl group, β-oxotricyclo[2.2.1.0$^{2.6}$]heptyl group, β-oxocaranyl group, β-oxopinanyl group or β-oxobornyl group.

5. A resin composition according to claim 1, wherein the counter ion $Y^-$ in the general formulas (1A) and (1B) is $BF_4^-$, $AsF_6^-$, $SbF_6^-$, $PF_6^-$ or $CF_3SO_3^-$.

6. A resin composition according to claim 1, wherein said alkylsulfonium salt is selected from the group consisting of adamantylmethyl(β-oxocyclohexyl)sulfonium trifluoromethanesulfonate, β-oxocyclohexylmethyl(2-norbornyl)sulfonium trifluoromethanesulfonate and cyclohexylmethyl(β-oxonorbornyl)sulfonium trifluoromethanesulfonate.

7. A resin composition according to claim 1, wherein said organic polymer has the structure represented by the general formula (2):

where $R^4$ is a monocyclic or bridged cyclic hydrocarbon group, $R^5$ is methyl group, ethyl group, propyl group, tert-butyl group, tetrahydropyran-2-yl group, tetrahydrofuran-2-yl group or 3-oxocyclohexyl group, $R^6$, $R^7$ and $R^8$ are independently hydrogen atom or methyl group, x+y+z=1, x is from 0.1 to 0.9, y is from 0.1 to 0.7, z is from 0.01 to 0.7, and n is an integer from 5 to 1000.

8. A resin composition according to claim 7, wherein $R^4$ in the general formula (2) is norbornyl group, adamantyl group, cyclohexyl group or tricyclo-[5.2.1.0$^{2.6}$]decanyl group.

9. A resin composition according to claim 7, wherein said organic polymer is, as a film having a thickness of 1 μm, not lower than 40% in transmittance of deep UV rays ranging from 220 to 180 nm in wavelength.

10. A resin composition according to claim 1, wherein said organic polymer has the structure represented by the general formula (3):

where $R^6$ and $R^7$ are independently hydrogen atom or methyl group, $R^9$ is hydrogen atom, methyl group, ethyl group, propyl group, tert-butyl group, tert-butoxycarbonyl group, tetrahydropyran-2-yl group, tetrahydrofuran-2-yl group or 3-oxocyclohexyl group, $R^{10}$ and $R^{11}$ are independently $C_7$ to $C_{12}$ hydrocarbon group having a bridged cyclic hydrocarbon radical, w is from 0.1 to 0.99, and m is an integer from 5 to 1000.

11. A resin composition according to claim 10, wherein $R^{10}$ and $R^{11}$ in the general formula (3) are independently norbornane-2,3-diyl group, norbornane-2,3-dimethylene group, norbornane-2,5-dimethylene group, norbornane-2,6-dimethylene group, bicyclo[2.2.2]octene-2,3-dimethylene group, tricyclo[5.2.1.0$^{2.6}$]decane-diyl group, tricyclo[5.2.1.0$^{2.6}$]decanedimethylene group or adamantane-diyl group.

12. A resin composition according to claim 10, wherein said organic polymer is, as a film having a thickness of 1 μm, not lower than 40% in transmittance of deep UV rays ranging from 220 to 180 nm in wavelength.

13. A resin composition according to claim 1, wherein said organic polymer is a copolymer of tricyclo-[5.2.1.0$^{2.6}$]decanyl acrylate, tetrahydropyranyl methacrylate and methacrylic acid.

14. A resin composition according to claim 1, wherein the proportion of said alkylsulfonium salt to said organic polymer is in the range from 0.1:99.9 to 40:60 by weight.

15. A resin composition according to claim 14, wherein said proportion is in the range from 0.5:99.5 to 25:75 by weight.

16. A photoresist comprising the photosensitive resin composition of claim 1, wherein the sulfonium salt amount is in a range of 0.1 to 40 weight percent.

17. A resin composition according to claim 7, wherein x is from 0.3 to 0.7.

18. A resin composition according to claim 7, wherein y is from 0.3 to 0.5.

19. A resin composition according to claim 7, wherein z is from 0.05 to 0.3.

20. A resin composition according to claim 7, wherein n is from 10 to 200.

21. A resin composition according to claim 10, wherein w is from 0.4 to 0.8.

22. A resin composition according to claim 10, wherein m is from 10 to 200.

* * * * *